United States Patent
Hu et al.

(10) Patent No.: US 7,344,431 B2
(45) Date of Patent: *Mar. 18, 2008

(54) PAD ASSEMBLY FOR ELECTROCHEMICAL MECHANICAL PROCESSING

(75) Inventors: Yongqi Hu, Campbell, CA (US); Stan D. Tsai, Fremont, CA (US); Yan Wang, Sunnyvale, CA (US); Feng Q. Liu, San Jose, CA (US); Shou-Sung Chang, Stanford, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/458,356

(22) Filed: Jul. 18, 2006

(65) Prior Publication Data

US 2007/0034506 A1 Feb. 15, 2007

Related U.S. Application Data

(63) Continuation of application No. 10/727,724, filed on Dec. 3, 2003, now Pat. No. 7,077,721, which is a continuation-in-part of application No. 10/642,128, filed on Aug. 15, 2003, now Pat. No. 6,962,524, which is a continuation-in-part of application No. 10/608,513, filed on Jun. 26, 2003, and a continuation-in-part of application No. 10/391,324, filed on Mar. 18, 2003, and a continuation-in-part of application No. 10/244,697, filed on Sep. 16, 2002, now Pat. No. 6,991,526, and a continuation-in-part of application No. 10/244,688, filed on Sep. 16, 2002, now Pat. No. 6,848,970, and a continuation-in-part of application No. 10/211,626, filed on Aug. 2, 2002, now Pat. No. 7,125,477, and a continuation-in-part of application No. 10/210,972, filed on Aug. 2, 2002, now Pat. No. 7,303,662, and a continuation-in-part of application No. 10/151,538, filed on May 16, 2002, now abandoned, which is a continuation-in-part of application No. 10/140,010, filed on May 7, 2002, now Pat. No. 6,979,248, which is a continuation-in-part of application No. 10/033,732, filed on Dec. 27, 2001, now Pat. No. 7,066,800, which is a continuation-in-part of application No. 09/505,899, filed on Feb. 17, 2000, now Pat. No. 6,537,144.

(51) Int. Cl.
*B24D 11/02* (2006.01)
*C25D 17/00* (2006.01)
*C25F 3/00* (2006.01)
*C25C 7/04* (2006.01)

(52) U.S. Cl. .................... 451/5; 451/527; 204/224 M; 205/663

(58) Field of Classification Search ................ 451/5, 451/526–539; 204/224 M; 205/103, 663
See application file for complete search history.

(56) References Cited

U.S. PATENT DOCUMENTS 1,601,642 A 9/1926 Parker
(Continued)

FOREIGN PATENT DOCUMENTS

EP 0 325 753 8/1989
(Continued)

OTHER PUBLICATIONS

PCT International Search Report and Written Opinion for PCT/US2006/004114, dated Jul. 14, 2006 (APPM/004100.PC.13).
(Continued)

*Primary Examiner*—David B Thomas
(74) *Attorney, Agent, or Firm*—Patterson & Sheridan, LLP

(57) ABSTRACT

Embodiments of a processing pad assembly for processing a substrate are provided. The processing pad assembly includes an upper layer having a processing surface and an electrode having a top side coupled to the upper layer and a bottom side opposite the top side. A first set of holes is formed through the upper layer for exposing the electrode to the processing surface. At least one aperture is formed through the upper layer and the electrode.

21 Claims, 5 Drawing Sheets

U.S. PATENT DOCUMENTS

| | | |
|---|---|---|
| 1,927,162 A | 9/1933 | Fiedler et al. |
| 2,112,691 A | 3/1938 | Crowder |
| 2,240,265 A | 4/1941 | Nachtman |
| 2,392,687 A | 1/1946 | Nachtman |
| 2,431,065 A | 11/1947 | Miller |
| 2,451,341 A | 10/1948 | Jernstadt |
| 2,453,481 A | 11/1948 | Wilson |
| 2,454,935 A | 11/1948 | Miller |
| 2,456,185 A | 12/1948 | Grube |
| 2,457,510 A | 12/1948 | van Ornum |
| 2,458,676 A | 1/1949 | Brenner et al. |
| 2,461,556 A | 2/1949 | Lorig |
| 2,473,290 A | 6/1949 | Millard |
| 2,477,808 A | 8/1949 | Jones |
| 2,479,323 A | 8/1949 | Davis |
| 2,480,022 A | 8/1949 | Hogaboom |
| 2,490,055 A | 12/1949 | Hoff |
| 2,495,695 A | 1/1950 | Camin et al. |
| 2,500,205 A | 3/1950 | Schaefar |
| 2,500,206 A | 3/1950 | Schaefar et al. |
| 2,503,863 A | 4/1950 | Bart |
| 2,506,794 A | 5/1950 | Kennedy et al. |
| 2,509,304 A | 5/1950 | Klein |
| 2,512,328 A | 6/1950 | Hays |
| 2,517,907 A | 8/1950 | Mikulas |
| 2,519,945 A | 8/1950 | Twele et al. |
| 2,530,677 A | 11/1950 | Berkenkotter et al. |
| 2,535,966 A | 12/1950 | Tepitz |
| 2,536,912 A | 1/1951 | Cobertt |
| 2,539,898 A | 1/1951 | Davis |
| 2,540,175 A | 2/1951 | Rosenqvist |
| 2,544,510 A | 3/1951 | Prahl |
| 2,549,678 A | 4/1951 | Fiandt |
| 2,544,943 A | 5/1951 | Farmer |
| 2,556,017 A | 6/1951 | Vonada |
| 2,560,534 A | 7/1951 | Adler |
| 2,560,966 A | 7/1951 | Lee |
| 2,569,577 A | 10/1951 | Reading |
| 2,569,578 A | 10/1951 | Rieger |
| 2,571,709 A | 10/1951 | Gray |
| 2,576,074 A | 11/1951 | Nachtman |
| 2,587,630 A | 3/1952 | Konrad et al. |
| 2,619,454 A | 11/1952 | Zaponi |
| 2,633,452 A | 3/1953 | Hogaboom, Jr. et al. |
| 2,646,396 A | 7/1953 | Henderson |
| 2,656,283 A | 10/1953 | Fink et al. |
| 2,656,284 A | 10/1953 | Toulmin |
| 2,657,177 A | 10/1953 | Rendel |
| 2,657,457 A | 11/1953 | Toulmin |
| 2,673,836 A | 3/1954 | Vonada |
| 2,674,550 A | 4/1954 | Dunlevy et al. |
| 2,675,348 A | 4/1954 | Greenspan |
| 2,680,710 A | 6/1954 | Kenmore et al. |
| 2,684,939 A | 7/1954 | Geese |
| 2,696,859 A | 8/1954 | Gray et al. |
| 2,689,215 A | 9/1954 | Bart |
| 2,695,269 A | 11/1954 | de Witz et al. |
| 2,698,832 A | 1/1955 | Swanson |
| 2,706,173 A | 4/1955 | Wells et al. |
| 2,706,175 A | 4/1955 | Licharz |
| 2,708,445 A | 5/1955 | Manson et al. |
| 2,710,834 A | 6/1955 | Vrilakas |
| 2,711,993 A | 6/1955 | Lyon |
| 3,162,568 A | 12/1964 | Bell |
| 3,334,041 A | 8/1967 | Dyer et al. |
| 3,433,730 A | 3/1969 | Kennedy et al. |
| 3,448,023 A | 6/1969 | Bell |
| 3,476,677 A | 11/1969 | Corley et al. |
| 3,607,707 A | 9/1971 | Chenevier |
| 3,873,512 A | 3/1975 | Latanision |
| 3,942,959 A | 3/1976 | Markoo et al. |
| 3,992,178 A | 11/1976 | Markoo et al. |
| 4,047,902 A | 9/1977 | Wiand |
| 4,082,638 A | 4/1978 | Jumer |
| 4,119,515 A | 10/1978 | Costakis |
| 4,125,444 A | 11/1978 | Inoue |
| 4,312,716 A | 1/1982 | Maschler et al. |
| 4,523,411 A | 6/1985 | Freerks |
| 4,704,511 A | 11/1987 | Miyano |
| 4,713,149 A | 12/1987 | Hoshino |
| 4,752,371 A | 6/1988 | Kreisel et al. |
| 4,772,361 A | 9/1988 | Dorsett et al. |
| 4,793,896 A | 12/1988 | Kaanta et al. |
| 4,839,993 A | 6/1989 | Masuko et al. |
| 4,934,102 A | 6/1990 | Leach et al. |
| 4,954,141 A | 9/1990 | Takiyama et al. |
| 4,956,056 A | 9/1990 | Zubatova et al. |
| 5,011,510 A | 4/1991 | Hayakawa et al. |
| 5,061,294 A | 10/1991 | Harmer et al. |
| 5,066,370 A | 11/1991 | Andreshak et al. |
| 5,096,550 A | 3/1992 | Mayer et al. |
| 5,136,817 A | 8/1992 | Tabata et al. |
| 5,137,542 A | 8/1992 | Buchanan et al. |
| 5,203,884 A | 4/1993 | Buchanan et al. |
| 5,217,566 A | 6/1993 | Datta et al. |
| 5,225,034 A | 7/1993 | Yu et al. |
| 5,257,478 A | 11/1993 | Hyde et al. |
| 5,328,716 A | 7/1994 | Buchanan |
| 5,478,435 A | 12/1995 | Murphy et al. |
| 5,534,106 A | 7/1996 | Cote et al. |
| 5,543,032 A | 8/1996 | Datta et al. |
| 5,560,753 A | 10/1996 | Schnabel et al. |
| 5,562,529 A | 10/1996 | Kishii et al. |
| 5,567,300 A | 10/1996 | Datta et al. |
| 5,575,706 A | 11/1996 | Tsai et al. |
| 5,578,362 A | 11/1996 | Reinhardt et al. |
| 5,624,300 A | 4/1997 | Kishii et al. |
| 5,633,068 A | 5/1997 | Ryoke et al. |
| 5,654,078 A | 8/1997 | Ferronato |
| 5,674,122 A | 10/1997 | Krech |
| 5,702,811 A | 12/1997 | Ho et al. |
| 5,738,574 A | 4/1998 | Tolles et al. |
| 5,804,507 A | 9/1998 | Perlov et al. |
| 5,807,165 A | 9/1998 | Uzoh et al. |
| 5,823,854 A | 10/1998 | Chen |
| 5,840,190 A | 11/1998 | Scholander et al. |
| 5,840,629 A | 11/1998 | Carpio |
| 5,846,882 A | 12/1998 | Birang |
| 5,871,392 A | 2/1999 | Meikle et al. |
| 5,876,271 A | 3/1999 | Oliver |
| 5,882,491 A | 3/1999 | Wardle |
| 5,893,796 A | 4/1999 | Birang et al. |
| 5,911,619 A | 6/1999 | Uzoh et al. |
| 5,931,719 A | 8/1999 | Nagahara et al. |
| 5,938,801 A | 8/1999 | Robinson |
| 5,948,697 A | 9/1999 | Hata |
| 5,985,093 A | 11/1999 | Chen |
| 6,001,008 A | 12/1999 | Fujimori et al. |
| 6,004,880 A | 12/1999 | Liu et al. |
| 6,010,395 A | 1/2000 | Nakajima |
| 6,017,265 A | 1/2000 | Cook et al. |
| 6,020,264 A | 2/2000 | Lustig et al. |
| 6,024,630 A | 2/2000 | Shendon et al. |
| 6,033,293 A | 3/2000 | Crevasse et al. |
| 6,056,851 A | 5/2000 | Hsieh et al. |
| 6,066,030 A | 5/2000 | Uzoh |
| 6,077,337 A | 6/2000 | Lee |
| 6,090,239 A | 7/2000 | Liu et al. |
| 6,103,096 A | 8/2000 | Datta et al. |
| 6,116,998 A | 9/2000 | Damgaard et al. |
| 6,132,292 A | 10/2000 | Kubo |
| 6,153,043 A | 11/2000 | Edelstein et al. |
| 6,156,124 A | 12/2000 | Tobin |
| 6,159,079 A | 12/2000 | Zuniga et al. |

| | | | | | | |
|---|---|---|---|---|---|---|
| 6,171,467 B1 | 1/2001 | Weihs et al. | | 6,982,624 B2 | 11/2005 | Butterfield et al. |
| 6,176,992 B1 | 1/2001 | Talieh | | 7,077,721 B2 * | 7/2006 | Hu et al. ............... 451/5 |
| 6,176,998 B1 | 1/2001 | Wardle et al. | | 2001/0005667 A1 | 6/2001 | Tolles et al. |
| 6,183,354 B1 | 2/2001 | Zuniga et al. | | 2001/0024878 A1 | 9/2001 | Nakamura |
| 6,190,494 B1 | 2/2001 | Dow | | 2001/0027018 A1 | 10/2001 | Molnar |
| 6,210,257 B1 | 4/2001 | Carlson | | 2001/0035354 A1 | 11/2001 | Ashjaee et al. |
| 6,234,870 B1 | 5/2001 | Uzoh et al. | | 2001/0036748 A1 | 11/2001 | Sato et al. |
| 6,238,271 B1 | 5/2001 | Cesna | | 2001/0040100 A1 | 11/2001 | Wang |
| 6,238,592 B1 | 5/2001 | Hardy et al. | | 2001/0042690 A1 | 11/2001 | Talieh |
| 6,244,935 B1 | 6/2001 | Birang et al. | | 2002/0008038 A1 | 1/2002 | Wang |
| 6,248,222 B1 | 6/2001 | Wang | | 2002/0011417 A1 | 1/2002 | Talieh et al. |
| 6,251,235 B1 | 6/2001 | Talieh et al. | | 2002/0020621 A1 | 2/2002 | Uzoh et al. |
| 6,257,953 B1 | 7/2001 | Gitis et al. | | 2002/0025760 A1 | 2/2002 | Lee et al. |
| 6,258,223 B1 | 7/2001 | Cheung et al. | | 2002/0025763 A1 | 2/2002 | Lee et al. |
| 6,261,166 B1 | 7/2001 | Jensen et al. | | 2002/0025780 A1 | 2/2002 | Lee et al. |
| 6,261,959 B1 | 7/2001 | Travis et al. | | 2002/0070126 A1 | 6/2002 | Sato |
| 6,273,798 B1 | 8/2001 | Berman | | 2002/0077037 A1 | 6/2002 | Tietz |
| 6,296,557 B1 | 10/2001 | Walker | | 2002/0088716 A1 | 7/2002 | Talieh et al. |
| 6,297,159 B1 | 10/2001 | Paton | | 2002/0102653 A1 | 8/2002 | Li et al. |
| 6,319,108 B1 | 11/2001 | Adefris et al. | | 2002/0108881 A1 | 8/2002 | Emesh et al. |
| 6,319,420 B1 | 11/2001 | Dow | | 2002/0119286 A1 | 8/2002 | Chen et al. |
| 6,322,422 B1 | 11/2001 | Satou | | 2002/0123300 A1 | 9/2002 | Jones et al. |
| 6,328,642 B1 | 12/2001 | Pant et al. | | 2002/0130049 A1 | 9/2002 | Chen et al. |
| 6,328,872 B1 | 12/2001 | Talieh et al. | | 2002/0146963 A1 | 10/2002 | Teetzel |
| 6,331,135 B1 | 12/2001 | Sabde et al. | | 2003/0013397 A1 | 1/2003 | Rhoades |
| 6,368,184 B1 | 4/2002 | Beckage | | 2003/0034131 A1 | 2/2003 | Park et al. |
| 6,368,190 B1 | 4/2002 | Easter et al. | | 2003/0040188 A1 | 2/2003 | Hsu et al. |
| 6,372,001 B1 | 4/2002 | Omar et al. | | 2003/0116445 A1 | 6/2003 | Sun et al. |
| 6,381,169 B1 | 4/2002 | Bocian et al. | | 2003/0116446 A1 | 6/2003 | Duboust et al. |
| 6,383,066 B1 | 5/2002 | Chen et al. | | 2003/0129927 A1 | 7/2003 | Lee et al. |
| 6,386,956 B1 | 5/2002 | Sato et al. | | 2003/0209446 A1 | 11/2003 | Hu et al. |
| 6,391,166 B1 | 5/2002 | Wang | | 2003/0213703 A1 | 11/2003 | Wang et al. |
| 6,395,152 B1 | 5/2002 | Wang | | 2004/0020788 A1 | 2/2004 | Maviev et al. |
| 6,402,591 B1 | 6/2002 | Thornton | | 2004/0020789 A1 | 2/2004 | Hu et al. |
| 6,402,925 B2 | 6/2002 | Talieh | | 2004/0023495 A1 | 2/2004 | Butterfield et al. |
| 6,406,363 B1 | 6/2002 | Xu et al. | | 2004/0082268 A1 | 4/2004 | Tiatz et al. |
| 6,409,904 B1 | 6/2002 | Uzoh et al. | | 2004/0134792 A1 | 7/2004 | Butterfield et al. |
| 6,413,388 B1 | 7/2002 | Uzoh et al. | | 2004/0163945 A1 | 8/2004 | Chang et al. |
| 6,413,403 B1 | 7/2002 | Lindquist et al. | | 2004/0266327 A1 | 12/2004 | Chen et al. |
| 6,428,394 B1 | 8/2002 | Mooring et al. | | 2005/0000801 A1 | 1/2005 | Wang et al. |
| 6,431,968 B1 | 8/2002 | Chen et al. | | 2005/0092621 A1 | 5/2005 | Hu et al. |
| 6,440,295 B1 | 8/2002 | Wang | | 2005/0133363 A1 | 6/2005 | Hu et al. |
| 6,447,668 B1 | 9/2002 | Wang | | 2005/0161341 A1 | 7/2005 | Doboust et al. |
| 6,447,868 B1 | 9/2002 | Wang | | 2005/0178666 A1 | 8/2005 | Tsai et al. |
| 6,471,847 B2 | 10/2002 | Talieh et al. | | 2005/0194681 A1 | 9/2005 | Hu et al. |
| 6,475,332 B1 | 11/2002 | Boyd et al. | | | | |
| 6,479,962 B2 | 11/2002 | Ziemkowski et al. | | FOREIGN PATENT DOCUMENTS | | |
| 6,482,307 B2 | 11/2002 | Ashjaee et al. | | EP | 0 455 455 | 11/1991 |
| 6,497,800 B1 | 12/2002 | Talieh et al. | | JP | 58-171264 | 10/1983 |
| 6,517,426 B2 | 2/2003 | Lee | | JP | 61-079666 | 4/1986 |
| 6,520,843 B1 | 2/2003 | Halley | | JP | 61268279 | 11/1986 |
| 6,537,140 B1 | 3/2003 | Miller et al. | | JP | 63-028512 | 2/1988 |
| 6,537,144 B1 | 3/2003 | Tsai et al. | | JP | 05-277957 | 10/1993 |
| 6,551,179 B1 | 4/2003 | Halley | | JP | 06-047678 | 2/1994 |
| 6,561,873 B2 | 5/2003 | Tsai et al. | | JP | 10-006213 | 1/1998 |
| 6,561,889 B1 | 5/2003 | Xu et al. | | JP | 10-16213 | 1/1998 |
| 6,569,004 B1 | 5/2003 | Pham | | JP | 2870537 | 1/1999 |
| 6,572,463 B1 | 6/2003 | Xu et al. | | JP | 11-042554 | 2/1999 |
| 6,585,579 B2 | 7/2003 | Jensen et al. | | JP | 2870537 | 3/1999 |
| 6,630,059 B1 | 10/2003 | Uzoh et al. | | JP | 2000-216513 | 8/2000 |
| 6,638,863 B2 | 10/2003 | Wang et al. | | JP | 2000-218513 | 8/2000 |
| 6,641,471 B1 | 11/2003 | Pinheiro et al. | | JP | 11-216663 | 12/2000 |
| 6,658,019 B1 | 12/2003 | Chen et al. | | JP | 2001-77117 | 3/2001 |
| 6,665,959 B1 | 12/2003 | Uzoh et al. | | JP | 2001-179611 | 7/2001 |
| 6,685,548 B2 | 2/2004 | Chen et al. | | JP | 2001-244223 | 9/2001 |
| 6,692,338 B1 | 2/2004 | Kirchner | | JP | 345 3352 | 3/2002 |
| 6,726,823 B1 | 4/2004 | Wang et al. | | KR | 2003-037158 | 5/2003 |
| 6,739,951 B2 | 5/2004 | Sun et al. | | SU | 1618538 | 1/1991 |
| 6,752,700 B2 | 6/2004 | Duescher | | WO | WO 93/15679 | 8/1993 |
| 6,769,969 B1 | 8/2004 | Duescher | | WO | WO 98/49723 | 11/1998 |
| 6,802,955 B2 | 10/2004 | Emesh et al. | | WO | 99/41434 | 8/1999 |
| 6,848,977 B1 | 2/2005 | Cook et al. | | WO | 99/53119 | 10/1999 |
| 6,856,761 B2 | 2/2005 | Doran | | | | |

| | | |
|---|---|---|
| WO | WO 99/85072 | 12/1999 |
| WO | 00/03426 | 1/2000 |
| WO | 00/28443 | 5/2000 |
| WO | 00/33356 | 6/2000 |
| WO | 00/59682 | 10/2000 |
| WO | WO 00/71297 | 11/2000 |
| WO | 01/13416 | 2/2001 |
| WO | 01/49452 | 7/2001 |
| WO | 01/52307 | 7/2001 |
| WO | 01/63018 | 8/2001 |
| WO | 01/71066 | 9/2001 |
| WO | 01/88229 | 11/2001 |
| WO | 01/88954 | 11/2001 |
| WO | 02/23616 | 3/2002 |
| WO | 02/064314 | 8/2002 |
| WO | WO 02/075804 | 9/2002 |
| WO | 03/001581 | 1/2003 |
| WO | WO 03/099519 A1 | 12/2003 |
| WO | WO 2004/073926 A1 | 9/2004 |

OTHER PUBLICATIONS

Alexander, et al., "Electrically Conductive Polymer Nanocomposite Materials," www.afrihorizons.com/Briefs/Sept02/ML0206.html, Date Unknown.

Partial International Search / PCT Invitation to pay additional fees dated Nov. 14, 2002 (4100 PC 02).

Notification regarding review of justification for invitation to pay additional fees for PCT/US/02/11009 (4100 PC 02) dated Feb. 25, 2003.

International Search Report for PCT/US 02/11009 (4100 EP 02) dated Feb. 25, 2003.

PCT Written Opinion dated Apr. 1, 2003 for PCT/US02/11009. (4100 EP 02).

Notification of Transmittal of International Preliminary Examination Report dated Nov. 10, 2003 (4100 EP 02).

European Search Report for 03252801.0, dated Jan. 16, 2004 (7047 EP).

Communication pursuant to Article 96(2) EPC for Application No. 02728965.4, dated Jun. 11, 2004 (4100 EP 02).

Search Report issued by the Austrian Patent Office for corresponding Singapore Patent Application No. 200302562-4, provided by letter dated Oct. 7, 2004.

Invitation to pay additional fees dated Nov. 11, 2004 (4100 P5 PCT).

Notification of Transmittal of International Search Report and Written Opinion dated Feb. 21, 2005 (4100 PCT).

Notification of transmittal of the International Search report and Written Opinion dated Mar. 14, 2005 (4100 P5 PCT).

PCT International Search Report and Written Opinion dated Apr. 28, 2005 for PCT/US04/037870. (AMAT/4100PC09).

Contolini, "Electrochemical Planarization of ULSI Copper," Solid State Technology, vol. 40, No. 6, Jun. 1, 1997.

Nogami, "An Innovation in Integrate Porous Low-K Materials and Copper," *InterConnect Japan 2001*, Honeywell Seminar Dec. 6, 2001, p. 1-12.

European Examination Report dated Sep. 9, 2007 for European Application No. 05077958.6. (APPM/004100EPD1).

* cited by examiner

PAD ASSEMBLY FOR ELECTROCHEMICAL MECHANICAL PROCESSING

CROSS-REFERENCE TO RELATED APPLICATIONS

This application is a continuation of U.S. patent application Ser. No. 10/727,724, filed Dec. 3, 2003, now issued as U.S. Pat. No. 7,077,721, on Jul. 18, 2006, which is a continuation-in-part of U.S. patent application Ser. No. 10/642,128, filed Aug. 15, 2003 (hereinafter the '128 application), now issued as U.S. Pat. No. 6,962,524 on Nov. 8, 2005. The '128 application is a continuation-in-part of U.S. patent application Ser. No. 10/608,513, filed Jun. 26, 2003 (hereinafter the '513 application), now published as U.S. Publication No. 2004/0134792 on Jul. 15, 2004, which is a continuation-in-part of U.S. patent application Ser. No. 10/140,010, filed May 7, 2002, now issued as U.S. Pat. No. 6,979,248 on Dec. 27, 2005. The '513 application is also a continuation-in-part of U.S. patent application Ser. No. 10/211,626, filed Aug. 2, 2002, now published as U.S. Publication No. 2004/0023495 on Feb. 5, 2004, which is a continuation-in-part of U.S. patent application Ser. No. 10/033,732, filed Dec. 27, 2001, now issued as U.S. Pat. No. 7,066,800 on Jun. 27, 2006, which is a continuation-in-part of U.S. patent application Ser. No. 09/505,899, filed Feb. 17, 2000, now issued as U.S. Pat. No. 6,537,144 on Mar. 25, 2003. The '513 application is additionally a continuation-in-part of U.S. patent application Ser. No. 10/210,972, filed Aug. 2, 2002, now published as U.S. Publication No. 2004/0020788 on Feb. 5, 2004, which is also a continuation-in-part of U.S. patent application Ser. No. 09/505,899, filed Feb. 17, 2000, now issued as U.S. Pat. No. 6,537,144 on Mar. 25, 2003. The '513 application is further continuation-in-part of U.S. patent application Ser. No. 10/151,538, filed May 16, 2002, now published as U.S. Publication No. 2003/0213703 on Nov. 20, 2003. The '128 application is also a continuation-in-part of U.S. patent application Ser. No. 10/244,697, filed Sep. 16, 2002, now issued as U.S. Pat. No. 6,991,526 on Jan. 31, 2006. which is a continuation-in-part of U.S. application Ser. No. 10/244,688, filed Sep. 16, 2002, now issued as U.S. Pat. No. 6,848,970 on Feb. 1, 2005, and of U.S. patent application Ser. No. 10/391,324, filed Mar. 18, 2003, now published as U.S. Publication No. 2004/0182721 on Sep. 23, 2004. All of the above referenced applications are hereby incorporated by reference in their entireties.

This application is additionally related to U.S. patent application Ser. No. 10/033,732, filed on Dec. 27, 2001, now issued as U.S. Pat. No. 7,066,800 on Jun. 27, 2006; U.S. patent application Ser. No. 10/455,941, filed Jun. 6, 2003, now issued as U.S. Pat. No. 6,991,528 on Jan. 31, 2006; and U.S. patent application Ser. No. 10/455,895, filed Jun. 6, 2003, now published as 2004/0020789 on Feb. 5, 2004, all of which are also incorporated herein by reference in their entireties.

BACKGROUND OF THE INVENTION

1. Field of the Invention

Embodiments of the invention generally relate to a processing pad assembly for electrochemical mechanical processing.

2. Description of the Related Art

Electrochemical Mechanical Processing (ECMP) is a technique used to remove conductive materials from a substrate surface by electrochemical dissolution while concurrently polishing the substrate with reduced mechanical abrasion as compared to conventional Chemical Mechanical Polishing (CMP) processes. With revising the polarity of the bias, ECMP systems may generally be adapted for deposition of conductive material on the substrate. Electrochemical dissolution is performed by applying a bias between a cathode and a substrate surface to remove conductive materials from the substrate surface into a surrounding electrolyte. The bias may be applied to the substrate surface by a conductive contact disposed on or through a polishing material upon which the substrate is processed. A mechanical component of the polishing process is performed by providing relative motion between the substrate and the polishing material that enhances the removal of the conductive material from the substrate.

Copper is one material that may be polished using electrochemical mechanical polishing. Typically, copper is polished utilizing a two-step process. In the first step, the bulk of the copper is removed, typically leaving some copper residue on the substrate's surface. The copper residue is then removed in a second step, typically referred to as an over-polishing step.

However, the removal of copper residue may result in dishing of copper features below the plane of a surrounding material, typically a dielectric or other barrier layer. The amount of dishing typically is related to polishing chemistries and processing parameters utilized in the over polish step, along with the width of the copper features subjected to polishing. As the copper layer does not have a uniform thickness across the substrate, it is difficult to remove all the copper residue without causing dishing over some features and not removing all of the copper residue over others.

Thus, there is a need for an improved apparatus for electrochemical mechanical polishing.

SUMMARY OF THE INVENTION

In one embodiment, a processing pad assembly for processing a substrate is provided. The processing pad assembly includes an upper layer having a processing surface and an electrode having a top side coupled to the upper layer and a bottom side opposite the top side. A first set of holes is formed through the upper layer for exposing the electrode to the processing surface. At least one aperture is formed through the upper layer and the electrode.

In another embodiment, the processing pad assembly includes an upper layer having a processing surface and an electrode having a top side coupled to the upper layer and a bottom side opposite the top side. The electrode includes a first conductive zone and at least a second conductive zone. A first set of holes is formed through the upper layer for exposing the electrode to the processing surface. At least one aperture is formed through the upper layer and the electrode.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

A processing pad assembly adapted to enhance uniform removal of material from a substrate is provided herein. The processing pad assembly includes at least an electrode and a processing pad. The processing pad may be non-conductive or conductive.

Figure 1:
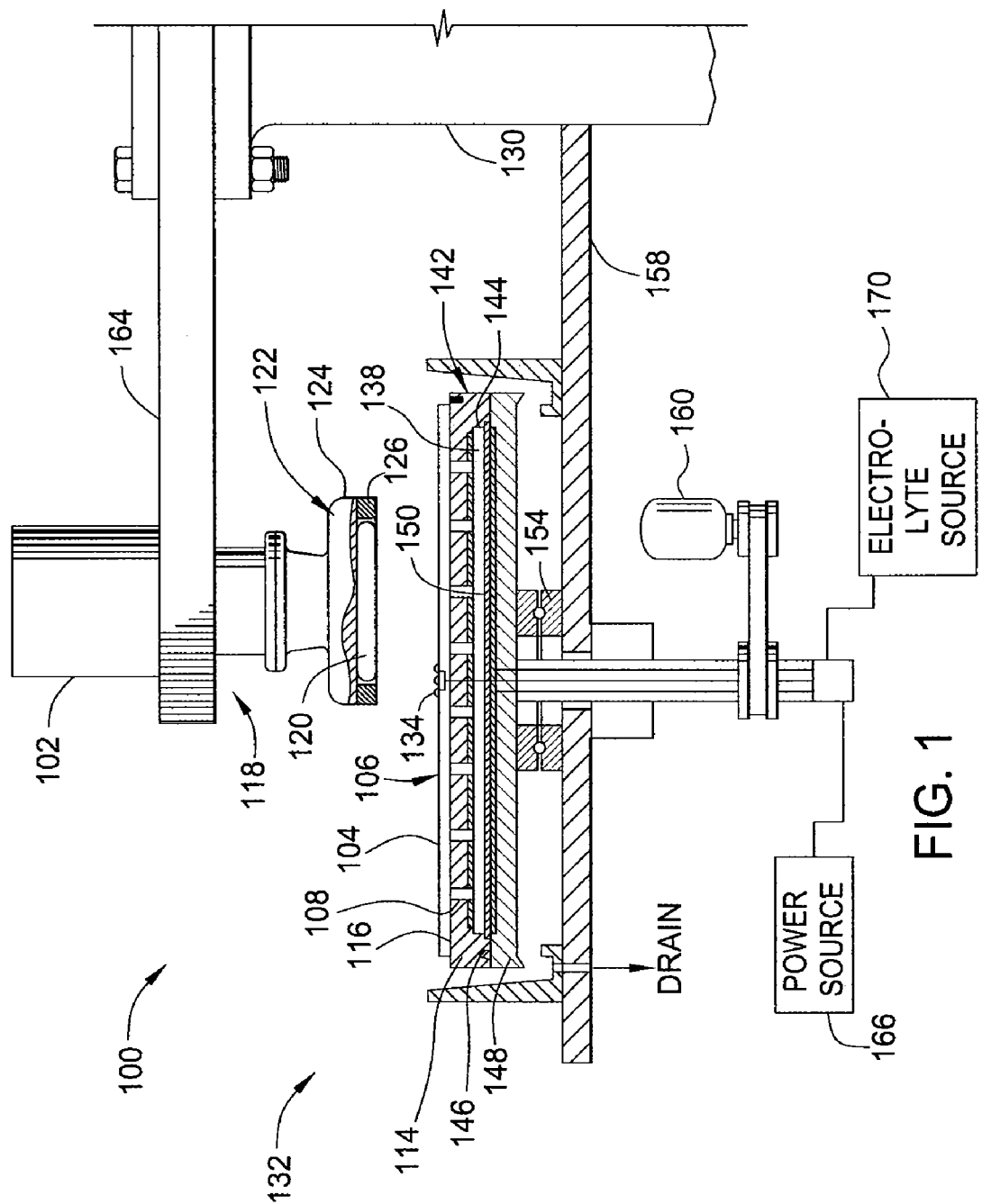
FIG. 1 is a side view, partially in cross-section, of a processing station of an electrochemical mechanical processing system having a processing pad assembly.

FIG. 1 depicts a sectional view of a processing station 100 having one embodiment of a processing pad assembly 106 of the present invention. The processing station 100 includes a carrier head assembly 118 adapted to hold a substrate 120 against a platen assembly 142. Relative motion is provided therebetween to polish the substrate 120. The relative motion may be rotational, lateral, or some combination thereof and may be provided by either or both of the carrier head assembly 118 and the platen assembly 142.

In one embodiment, the carrier head assembly 118 is adapted to hold a substrate 120 against a platen assembly 142 disposed in an ECMP station 132. The carrier head assembly 118 is supported by an arm 164 coupled to a base 130 and which extends over the ECMP station 132. The ECMP station may be coupled to or disposed proximate the base 130.

The carrier head assembly 118 generally includes a drive system 102 coupled to a carrier head 122. The drive system 102 generally provides at least rotational motion to the carrier head 122. The carrier head 122 additionally may be actuated toward the ECMP station 132 such that the substrate 120 retained in the carrier head 122 may be disposed against a processing surface 104 of the ECMP station 132 during processing.

In one embodiment, the carrier head 122 may be a TITAN HEAD™ or TITAN PROFILER™ wafer carrier manufactured by Applied Materials, Inc., of Santa Clara, Calif. Generally, the carrier head 122 comprises a housing 124 and retaining ring 126 that define a center recess in which the substrate 120 is retained. The retaining ring 126 circumscribes the substrate 120 disposed within the carrier head 122 to prevent the substrate from slipping out from under the carrier head 122 during processing. It is contemplated that other carrier heads may be utilized.

The ECMP station 132 generally includes a platen assembly 142 rotationally disposed on a base 158. A bearing 154 is disposed between the platen assembly 142 and the base 158 to facilitate rotation of the platen assembly 142 relative to the base 158. The platen assembly 142 is typically coupled to a motor 160 that provides the rotational motion to the platen assembly 142.

The platen assembly 142 has an upper plate 114 and a lower plate 148. The upper plate 114 may be fabricated from a rigid material, such as a metal or rigid plastic, and in one embodiment, is fabricated from or coated with a dielectric material, such as chlorinated polyvinyl chloride (CPVC). The upper plate 114 may have a circular, rectangular or other geometric form with a planar upper surface. A top surface 116 of the upper plate 114 supports the processing pad assembly 106 thereon. The processing pad assembly 106 may be held to the upper plate 114 of the platen assembly 142 by magnetic attraction, static attraction, vacuum, adhesives, or the like.

The lower plate 148 is generally fabricated from a rigid material, such as aluminum and may be coupled to the upper plate 114 by any conventional means, such as a plurality of fasteners (not shown). Generally, a plurality of locating pins 146 (one is shown in FIG. 1) are disposed between the upper and lower plates 114, 148 to ensure alignment therebetween. The upper plate 114 and the lower plate 148 may optionally be fabricated from a single, unitary member.

A plenum 138 is defined in the platen assembly 142 and may be partially formed in at least one of the upper or lower plates 114, 148. In the embodiment depicted in FIG. 1, the plenum 138 is defined in a recess 144 partially formed in the lower surface of the upper plate 114. At least one hole 108 is formed in the upper plate 114 to allow electrolyte, provided to the plenum 138 from an electrolyte source 170, to flow through the platen assembly 142 and into contact with the substrate 120 during processing. The plenum 138 is partially bounded by a cover 150 coupled to the upper plate 114 enclosing the recess 144. Alternatively, the electrolyte may be dispensed from a pipe (not shown) onto the top surface of the processing pad assembly 106.

At least one contact assembly 134 is disposed on the platen assembly 142 along with the processing pad assembly 106. The at least one contact assembly 134 extends at least to or beyond the upper surface of the processing pad assembly 106 and is adapted to electrically couple the substrate 120 to a power source 166. The processing pad assembly 106 is coupled to a different terminal of the power source 166 so that an electrical potential may be established between the substrate 120 and processing pad assembly 106.

In other words, during processing, when the substrate 120 is held against the processing pad assembly 106, the contact assembly 134 biases the substrate 120 by electrically coupling the substrate 120 to one terminal of the power source 166. The processing pad assembly 106 is coupled to another terminal of the power source 166. The electrolyte, which is introduced from the electrolyte source 170 and is disposed on the processing pad assembly 106, completes an electrical circuit between the substrate 120 and the processing pad assembly 106, which assists in the removal of material from the surface of the substrate 120.

Figure 2:
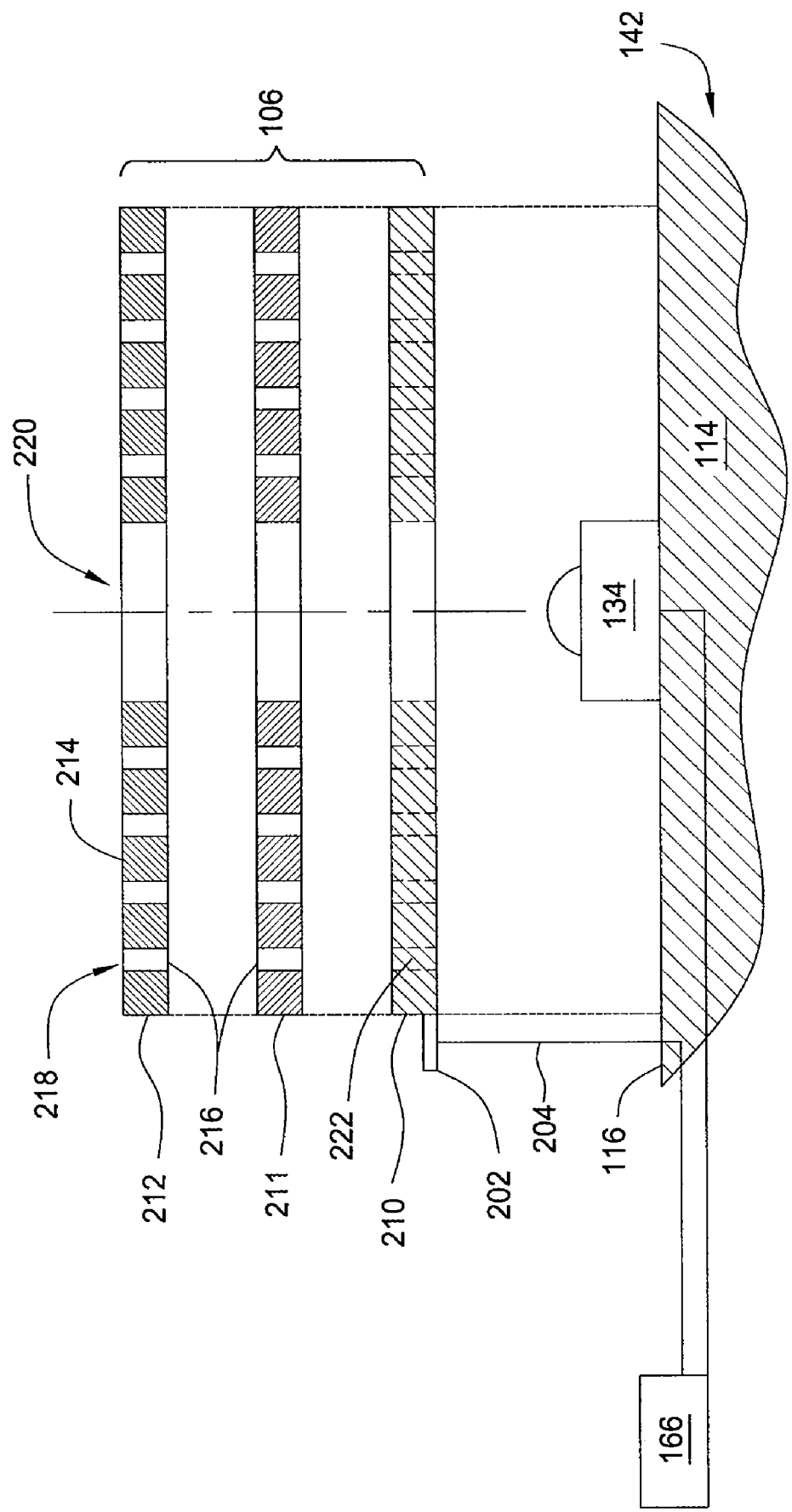
FIG. 2 is a partial sectional, exploded view of one embodiment of a platen and processing pad assembly of the processing station of FIG. 1.

FIG. 2 depicts a partial sectional, exploded view of the processing pad assembly 106 and platen assembly 142 of FIG. 1. The processing pad assembly 106 includes at least a non-conductive upper layer 212 and a conductive lower layer, or electrode, 210. In the embodiment depicted in FIG. 2, an optional subpad 211 is disposed between the electrode 210 and upper layer 212. The optional subpad 211 may be used in any of the embodiments of the processing pad assembly discussed herein. The electrode 210, subpad 211, and upper layer 212 of the processing pad assembly 106 may be combined into a unitary assembly by the use of adhesives, bonding, compression molding, or the like. In one embodiment, adhesive is used to attach the electrode 210, subpad 211, and upper layer 212 together. The adhesive may have a strong physical and/or chemical bond to the electrode 210, subpad 211, and upper layer 212 and may be resistant to electrolyte chemistries. Examples of suitable adhesive include, but are not limited to, urethane adhesives, acrylic adhesives, methacrylic adhesives, rubber-based adhesives, silicone adhesives, epoxy adhesives, and the like.

The adhesive bonding between the electrode 210, subpad 211, and upper layer 212 may be increased by the surface morphology of the materials selected to form the processing pad assembly 106 (i.e., fabrics, screens, and perforations versus solids), or by the use of an adhesion promoter. The adhesion promoter may be conductive. Examples of adhesion promoters include, but are not limited to, silane coupling agents, titanate coupling agents, and the like. Alternatively, one or more of the surfaces being adhered may be chemically treated or plasma treated to increase adhesion. It is contemplated that any combination of surface morphology, coupling agents, or chemical or plasma treatments may be used to obtain the desired adhesion between layers of the processing pad assembly 106.

The upper layer 212 may be fabricated from polymeric materials compatible with process chemistry, examples of which include polyurethane, polycarbonate, fluoropolymers, PTFE, PTFA, polyphenylene sulfide (PPS), or combinations thereof, and other materials suitable for use in electrochemical processing environments. In one embodiment, a processing surface 214 of the upper layer 212 of the processing pad assembly 106 is dielectric, for example, polyurethane or other polymer.

In another embodiment, the upper layer 212 of the processing pad assembly 106 may include a processing surface 214 that is conductive or made from a conductive composite (i.e., the conductive elements are dispersed integrally with or comprise the material comprising the processing surface), such as a polymer matrix having conductive particles dispersed therein or a conductive coated fabric, among others.

Examples of processing pad assemblies that may be adapted to benefit from the invention are described in U.S. patent application Ser. No. 10/455,941, filed Jun. 6, 2003 by Y. Hu et al. (entitled "CONDUCTIVE POLISHING ARTICLE FOR ELECTROCHEMICAL MECHANICAL POLISHING", and U.S. patent application Ser. No. 10/455,895, filed Jun. 6, 2003 by Y. Hu et al. (entitled "CONDUCTIVE POLISHING ARTICLE FOR ELECTROCHEMICAL MECHANICAL POLISHING", both of which are hereby incorporated by reference in their entireties.

In one embodiment, at least one permeable passage 218 is disposed at least through the upper layer 212 and extends at least to the electrode 210—i.e., the permeable passage 218 is disposed in any intervening layers such as, for example, the subpad 211. The passage 218 allows an electrolyte to establish a conductive path between the substrate 120 and the electrode 210. The passage 218 may be a permeable portion of the upper layer 212, holes formed in the upper layer 212, or a combination of the two. The subpad 211, when present, may also be formed of a permeable material or include holes which align with the holes formed in the upper layer 212. In the embodiment depicted in FIG. 2, the permeable passage 218 is a plurality of holes 216 formed in and through the upper layer 212 and the optional subpad 211 to allow an electrolyte to flow therethrough and come into contact with the electrode 210 during processing.

Optionally, an extension 222 of the permeable passage 218 may be formed in and at least partially through the electrode 210 (shown in phantom) in order to increase the surface area of the electrode 210 in contact with the electrolyte. The extension 222 may extend completely through the electrode 210. Larger surface area of electrolyte contact with the electrode 210 improves the rate of removal of material from the surface of the substrate 120 during processing.

The subpad 211 is typically made of a material softer, or more compliant, than the material of the upper layer 212. The difference in hardness or durometer between the upper layer 212 and the subpad 211 may be chosen to produce a desired polishing (or deposition) performance. Generally, the subpad 211 may have a durometer in the range of from about 8 Shore O to about 20 Shore D. The subpad 211 may also be compressive. Examples of suitable subpad 211 materials include, but are not limited to, foamed polymer, elastomers, felt, impregnated felt and plastics compatible with the processing chemistries.

The electrode 210 is disposed on the top surface 116 of the upper plate 114 of the platen assembly 142 and may be held there by magnetic attraction, static attraction, vacuum, adhesives, or the like. In one embodiment, adhesive is used to adhere the electrode 210 to the upper plate 114. It is contemplated that other layers, such as release films, liners, and other adhesive layers, may be disposed between the electrode 210 and the upper plate 114 to facilitate ease of handling, insertion, and removal of the processing pad assembly 106 in the processing station 100.

The electrode 210 has at least one terminal 202 to facilitate coupling to the power source 166, for example by securing the terminal 202 to a lead 204 of the power source 166 with a stainless steel screw (not shown). The electrode 210 may act as a single electrode, or may comprise multiple independent electrode zones isolated from each other. The electrode 210 is typically comprised of a corrosion resistant conductive material, such as metals, conductive alloys, metal coated fabrics, conductive polymers, conductive pads, and the like. Conductive metals include Sn, Ni, Cu, Au, and the like. Conductive metals also include a corrosion resistant metal such as Sn, Ni, or Au coated over an active metal such as Cu, Zn, Al, and the like. Conductive alloys include inorganic alloys and metal alloys such as bronze, brass, stainless steel, or palladium-tin alloys, among others. Metal coated fabric may be woven or non-woven with any corrosion resistant metal coating. Conductive pads consist of conductive fillers disposed in a polymer matrix. The electrode 210 should also be fabricated of a material compatible with electrolyte chemistries to minimize cross-talk between zones when multi-zoned electrodes are utilized. For example, metals stable in the electrolyte chemistries are able to minimize zone cross-talk.

Figure 5:
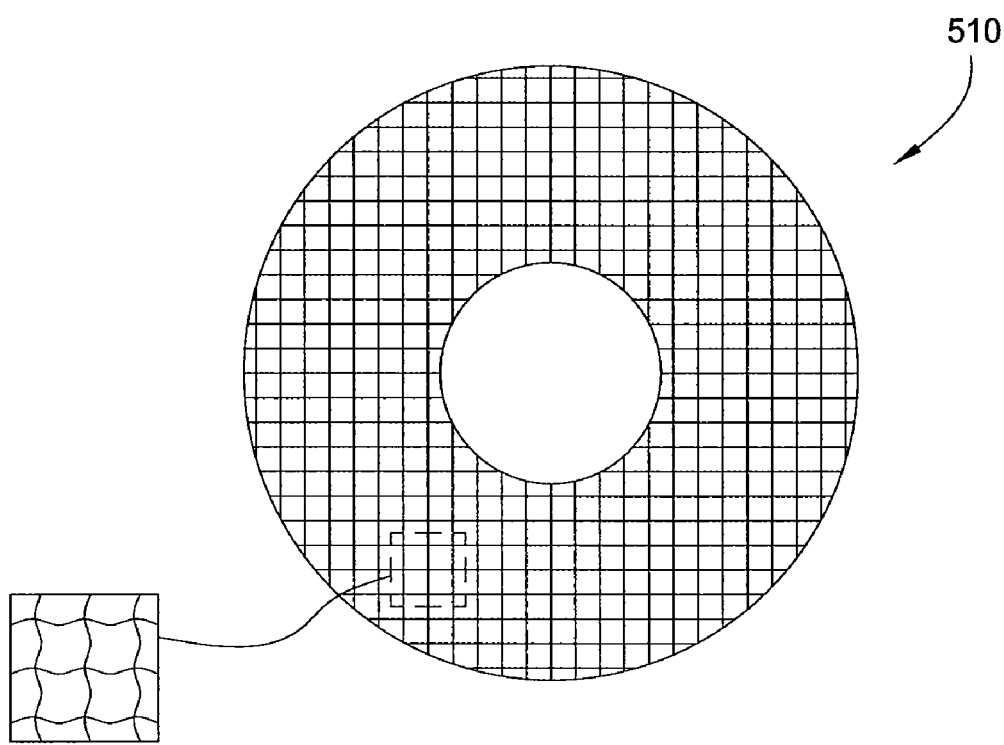
FIG. 5 is a plan view of another embodiment of an electrode of a processing pad assembly of the processing station of FIG. 1.
Figure 6:
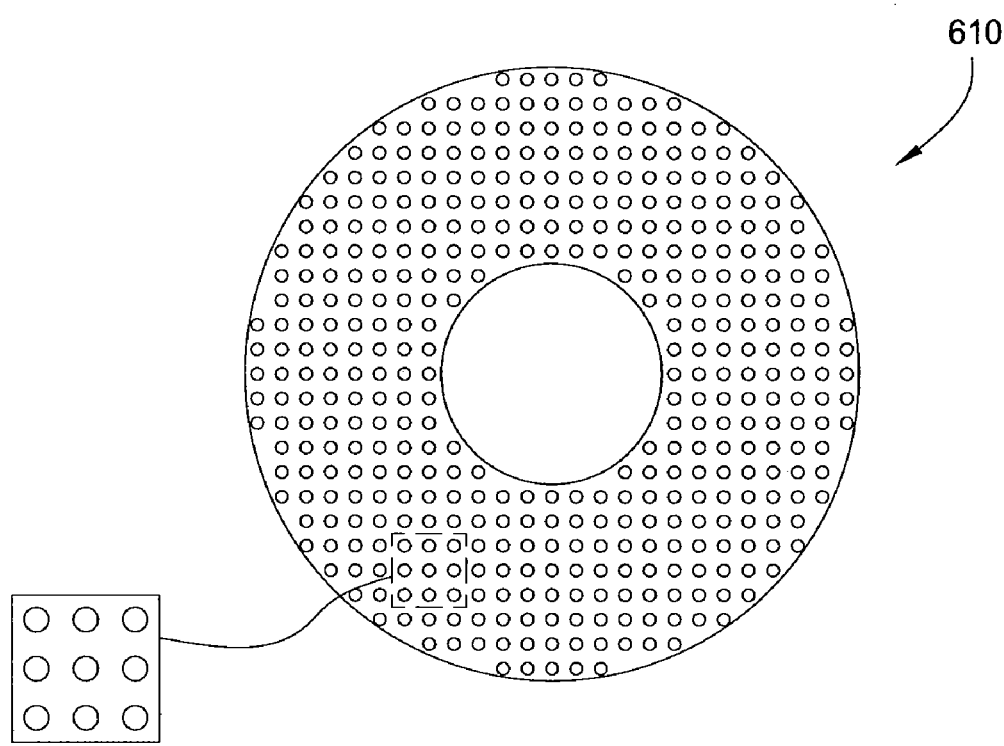
FIG. 6 is a plan view of another embodiment of an electrode of a processing pad assembly of the processing station of FIG. 1.

When metal is used as material for the electrode 210, it may be a solid sheet. Alternatively, the electrode 210 may be formed of a metal screen (as shown by electrode 510 depicted in FIG. 5) or perforated (as shown by electrode 610 as depicted in FIG. 6) in order to increase the adhesion to the upper layer 212 or optional subpad 211. The electrode 210 may also be primed with an adhesion promoter, as discussed above, to increase the adhesion to the upper layer 212 or optional subpad 211. An electrode 210 which is perforated or formed of a metal screen also has a greater surface area, which further increases the substrate removal rate during processing.

When the electrode 210 is fabricated from metal screen, a perforated metal sheet, or conductive fabric, one side of the electrode 210 may be laminated, coated, or molded with a polymer layer which penetrates the openings in the electrode 210 to further increase adhesion to the upper layer 212 or optional subpad 211. When the electrode 210 is formed from a conductive pad, the polymer matrix of the conductive pad may have a high affinity or interaction to an adhesive applied to the upper layer 212 or optional subpad 211.

At least one aperture 220 is formed in the electrode 210, optional subpad 211, and upper layer 212 of the processing pad assembly 106. Each of the at least one apertures 220 is of a size and location to accommodate a contact assembly 134 disposed therethrough. In one embodiment, the at least one aperture 220 is a single aperture formed in the center of the processing pad assembly 106 to accommodate a single contact assembly 134.

The contact assembly 134 is coupled to the power source 166. Although only one contact assembly 134 is shown coupled to the upper layer 114 of the platen assembly 142 in FIG. 2, any number of contact assemblies 134 may be utilized and may be distributed in any number of configurations on the upper layer 114 of the platen assembly 142.

Figure 3:
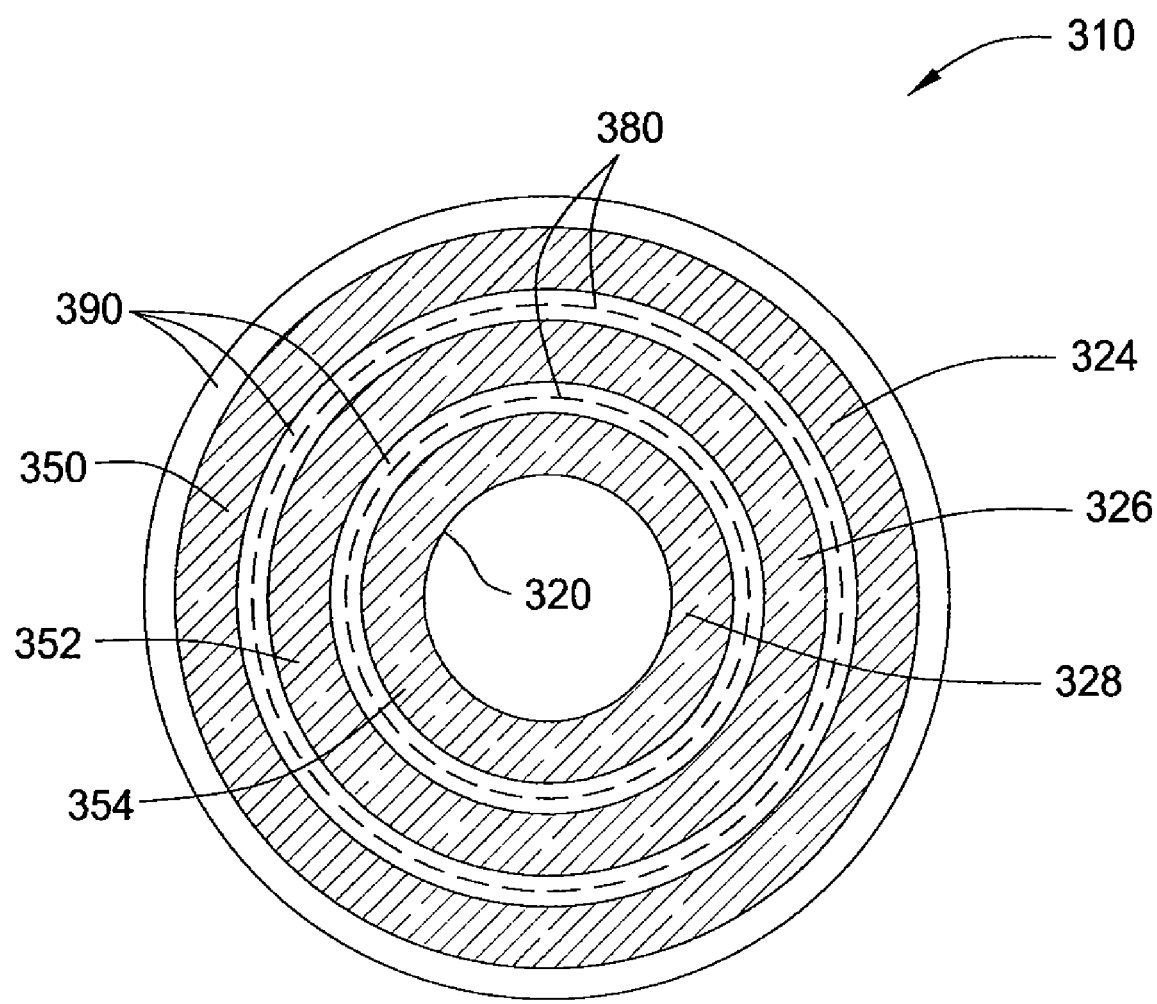
FIG. 3 is a plan view of one embodiment of an electrode of a processing pad assembly of the processing station of FIG. 1.
Figure 4:
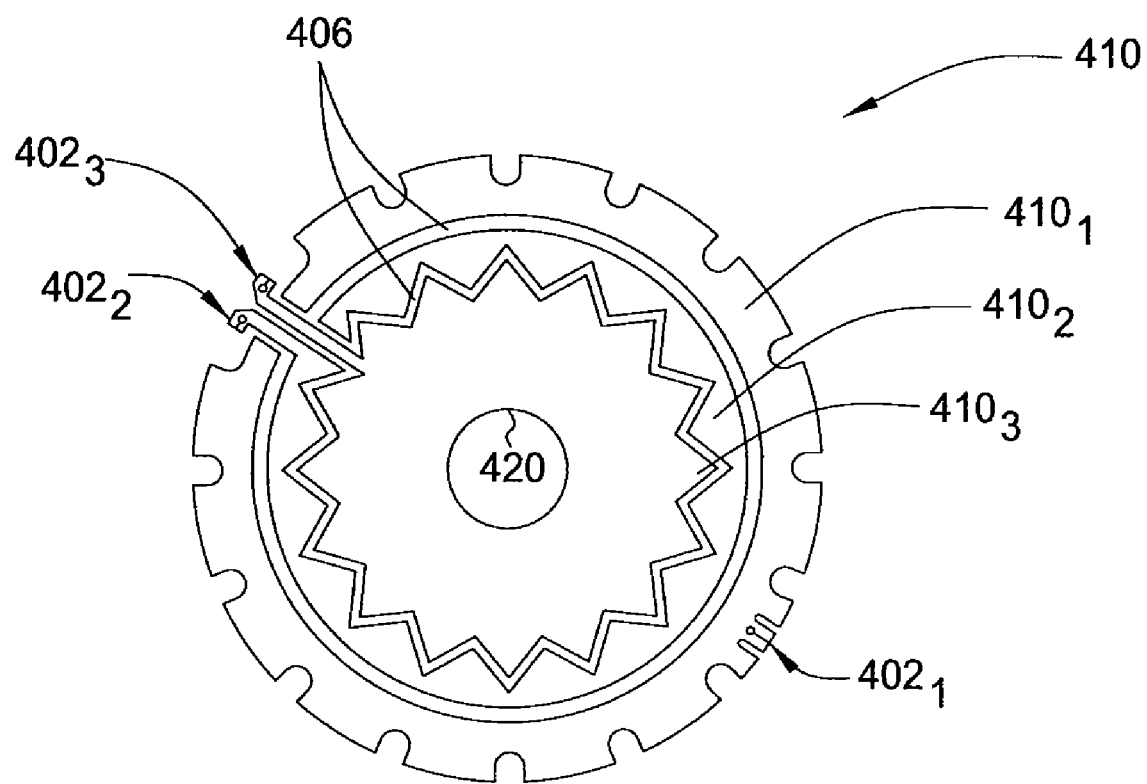
FIG. 4 is a plan view of another embodiment of an electrode of a processing pad assembly of the processing station of FIG. 1.

FIGS. 3 and 4 show bottom views of alternative embodiments of electrodes having multiple zones that may be advantageously adapted for use with the various embodiments of the invention described herein. In FIG. 3, the electrode 310 includes at least one dielectric spacer and at least two conductive elements. The conductive elements are arranged to create a plurality of independently biasable zones across the surface of the electrode 310. In the embodiment depicted in FIG. 3, the electrode 310 has at three conductive elements 350, 352, 354 that are electrically isolated from each other by dielectric spacers 390 to create electrode zones, an outer electrode zone 324, an intermediate electrode zone 326, and an inner electrode zone 328. Each electrode zone 324, 326, 328—shown separated by a dashed boundary 380—may be independently biased to allow the substrate polishing profile to be tailored. One example of a polishing method having electrode zone bias control is described in U.S. patent application Ser. No. 10/244,697, filed Sep. 16, 2002, which is hereby incorporated by reference in its entirety.

Although the electrode zones 324, 326, 328 and conductive elements 350, 352, 354 are shown as concentric rings, the electrode zones may be alternatively configured to suit a particular polishing application. For example, the electrode zones 324, 326, 328 and/or conductive elements 350, 352, 354 may be linear, curved, concentric, involute curves or other shapes and orientations are possible for the conductive elements. The electrode zones 324, 326, 328 and/or conductive elements 350, 352, 354 may be of substantially equal sizes and shapes from one zone to the next, or the sizes and shapes may vary depending upon the particular zone of concern.

FIG. 4 depicts another embodiment of an electrode 410 having a plurality of independently biasable electrode zones. In one embodiment, the electrode 410 has at least n zone electrodes (shown as three electrodes $410_1$, $410_2$, and $410_3$), wherein n is an integer of 2 or greater. The electrodes $410_1$, $410_2$, and $410_3$ each include a respective terminal $402_1$, $402_2$, $402_3$ for coupling to a power source. The electrodes $410_1$, $410_2$, and $410_3$ are generally separated by a dielectric spacer 406 or an air gap and each form an independent electrode zone. The electrodes $410_1$, $410_2$, and $410_3$ may include one or more apertures 420 to facilitate interfacing with one or more conductive elements, such as the contact assemblies 134 depicted in FIGS. 1 and 2.

While the foregoing is directed to the illustrative embodiment of the present invention, other and further embodiments of the invention may be devised without departing from the basic scope thereof, and the scope thereof is determined by the claims that follow.

The invention claimed is:

1. A processing pad assembly, comprising:
   a conductive upper layer having a conductive processing surface; and
   an electrode having a top side coupled to the upper layer and a bottom side opposite the top side, wherein a first set of holes is formed through the upper layer for exposing the electrode to the processing surface.

2. The processing pad assembly of claim 1, wherein the electrode is fabricated from a corrosion resistant conductive metal.

3. The processing pad assembly of claim 2, wherein the corrosion resistant conductive metal is Sn, Ni, Ti, or Au.

4. The processing pad assembly of claim 1, wherein the electrode is fabricated from a conductive metal coated with a corrosion resistant conductive metal.

5. The processing pad assembly of claim 4, wherein the corrosion resistant conductive metal is Sn, Ni, Ti, or Au.

6. The processing pad assembly of claim 1, wherein the electrode is fabricated from a corrosion-resistant conductive alloy.

7. The processing pad assembly of claim 6, wherein the corrosion-resistant conductive alloy is bronze, brass, stainless steel, or a palladium-tin alloy.

8. The processing pad assembly of claim 1, wherein the electrode is fabricated from a metal-coated fabric.

9. The processing pad assembly of claim 1, wherein the electrode is fabricated from a polymer matrix with a conductive filler.

10. The processing pad assembly of claim 2, wherein the electrode is a solid sheet.

11. The processing pad assembly of claim 2, wherein the electrode is a metal screen.

12. The processing pad assembly of claim 2, wherein the electrode is a perforated sheet.

13. The processing pad assembly of claim 2, wherein the electrode is primed with an adhesion promoter on a side facing the upper layer.

14. The processing pad assembly of claim 13, wherein the adhesion promoter is conductive.

15. The processing pad assembly of claim 1, wherein the electrode is permeable.

16. The processing pad assembly of claim 1, wherein the electrode is coupled to the upper layer by an adhesive.

17. The processing pad assembly of claim 1, wherein the electrode further comprises a plurality of independently biasable electrical zones.

18. The processing pad assembly of claim 17, wherein the electrical zones further comprises concentric rings.

19. The processing pad assembly of claim 1, further comprising a subpad disposed between the electrode and the conductive upper layer.

20. The processing pad assembly of claim 1, wherein the electrode further comprises:
   a first conductive zone; and
   at least a second conductive zone.

21. The processing pad assembly of claim 20, wherein the electrode further comprises:
   a first conductive element comprising the first conductive zone;
   a second conductive element circumscribing the first conductive element comprising a second conductive zone; and
   a third conductive element circumscribing the second conductive element comprising a third conductive zone.

* * * * *

UNITED STATES PATENT AND TRADEMARK OFFICE
CERTIFICATE OF CORRECTION

PATENT NO.        : 7,344,431 B2
APPLICATION NO.   : 11/458356
DATED             : March 18, 2008
INVENTOR(S)       : Hu et al.

It is certified that error appears in the above-identified patent and that said Letters Patent is hereby corrected as shown below:

Title Page
In the References Cited (56):

Please delete "2,535,966 A 12/1950 Tepitz" and insert --2,535,966 A 12/1950 Teplitz--;

Please delete "2,619,454 A 11/1952 Zaponi" and insert --2,619,454 A 11/1952 Zapponi--;

Please delete "2,646,396 A 7/1953 Henderson" and insert --2,646,398 A 7/1953 Henderson--;

Please delete "3,162,568 A 12/1964 Bell" and insert --3,162,588 A 12/1964 Bell--;

Please delete "4,793,896 A 12/1988 Kaanta et al." and insert --4,793,895 A 12/1988 Kaanta et al.--;

Please delete "5,217,566 A 6/1993 Datta et al." and insert --5,217,586 A 6/1993 Datta et al.--;

Please delete "6,261,166 B1 7/2001 Jensen et al." and insert --6,261,168 B1 7/2001 Jensen et al.--;

Please delete "6,447,868 B1 9/2002 Wang" and insert --6,447,668 B1 9/2002 Wang--;

Please delete "6,658,019 B1 12/2003 Chen et al." and insert --6,656,019 B1 12/2003 Chen et al.--;

Please delete "6,665,959 B1 12/2003 Uzoh et al." and insert --6,666,959 B1 12/2003 Uzoh et al.--;

Please delete "6,982,624 B2 11/2005 Butterfield et al." and insert --6,962,524 B2 11/2005 Butterfield et al.--;

Please delete "2001/0036748 A1 11/2001 Sato et al." and insert --2001/0036746 A1 11/2001 Sato et al.--;

Please delete "2002/0008038 A1 1/2002 Wang" and insert --2002/0008036 A1 1/2002 Wang--;

UNITED STATES PATENT AND TRADEMARK OFFICE
CERTIFICATE OF CORRECTION

| | | |
|---|---|---|
| PATENT NO. | : 7,344,431 B2 | |
| APPLICATION NO. | : 11/458356 | |
| DATED | : March 18, 2008 | |
| INVENTOR(S) | : Hu et al. | |

It is certified that error appears in the above-identified patent and that said Letters Patent is hereby corrected as shown below:

Please delete "2002/0025780 A1 2/2002 Lee et al." and insert --2002/0025760 A1 1/2002 Wang--;

Please delete "2002/0088716 A1 7/2002 Talieh et al." and insert --2002/0088715 A1 7/2002 Talieh et al.--;

Please delete "2002/0102653 A1 8/2002 Li et al." and insert --2002/0102853 A1 8/2002 Li et al.--;

Please delete "2002/0108881 A1 8/2002 Emesh et al." and insert --2002/0108861 A1 8/2002 Emesh et al.--;

Please delete "2003/0209446 A1 11/2003 Hu et al." and insert --2003/0209448 A1 8/2002 Hu et al.--;

Please delete "2004/0020788 A1 2/2004 Maviev et al." and insert --2004/0020788 A1 2/2004 Mavliev et al.--;

Please delete "2004/0082268 A1 4/2004 Tiatz et al." and insert --2004/0082288 A1 4/2004 Tietz et al.--;

Please delete "2004/0163945 A1 8/2004 Chang et al." and insert --2004/0163946 A1 8/2004 Chang et al.--;

Please delete "2005/0161341 A1 7/2005 Doboust et al." and insert --2005/0161341 A1 7/2005 Duboust et al.--;

UNITED STATES PATENT AND TRADEMARK OFFICE
CERTIFICATE OF CORRECTION

PATENT NO. : 7,344,431 B2
APPLICATION NO. : 11/458356
DATED : March 18, 2008
INVENTOR(S) : Hu et al.

It is certified that error appears in the above-identified patent and that said Letters Patent is hereby corrected as shown below:

Please delete "JP 61268279 11/1986" and insert --JP 61265279 11/1986--;

Please delete "JP 2000-216513 8/2000";

Please delete "WO WO 93/15679 8/1993" and insert --WO WO 93/15879 8/1993--;

Please delete "WO WO 99/85072 12/1999" and insert --WO WO 99/65072 12/1999--;

Please delete "WO 00/28443 5/2000" and insert --WO 00/26443 5/2000--.

Signed and Sealed this

Second Day of September, 2008

JON W. DUDAS
*Director of the United States Patent and Trademark Office*